(12) United States Patent
Cheng et al.

(10) Patent No.: US 7,470,584 B2
(45) Date of Patent: Dec. 30, 2008

(54) TEOS DEPOSITION METHOD

(75) Inventors: Yi-Lung Cheng, Danshuei Township, Taipei County (TW); Hong-Jui Chang, Sheton Shiang (TW); Ying-Lang Wang, Longjing Township, Taichung County (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 203 days.

(21) Appl. No.: 11/040,307

(22) Filed: Jan. 21, 2005

(65) Prior Publication Data

US 2006/0166514 A1    Jul. 27, 2006

(51) Int. Cl.
*H01L 21/31*    (2006.01)
*H01L 21/469*   (2006.01)
*H01L 21/8242*  (2006.01)

(52) U.S. Cl. .................. 438/240; 438/763; 438/790
(58) Field of Classification Search .............. 438/787, 438/788
See application file for complete search history.

(56) References Cited

U.S. PATENT DOCUMENTS

| | | | | |
|---|---|---|---|---|
| 5,795,833 A * | 8/1998 | Yu et al. | ..................... | 438/763 |
| 5,814,888 A * | 9/1998 | Nishioka et al. | ............ | 257/758 |
| 6,121,164 A | 9/2000 | Yieh et al. | ................... | 438/790 |
| 6,426,285 B1 * | 7/2002 | Chen et al. | ................... | 438/624 |
| 6,753,270 B1 * | 6/2004 | Geiger et al. | ............... | 438/780 |
| 2001/0030344 A1 * | 10/2001 | Shimomura et al. | ......... | 257/324 |
| 2002/0055268 A1 * | 5/2002 | Yu et al. | ..................... | 438/759 |
| 2007/0173058 A1 * | 7/2007 | Yamazaki | ................... | 438/642 |

* cited by examiner

*Primary Examiner*—Zandra Smith
*Assistant Examiner*—Pamela E Perkins
(74) *Attorney, Agent, or Firm*—Thomas, Kayden, Horstemeyer & Risley

(57) ABSTRACT

A TEOS deposition method. A mixture of gases is introduced into a process chamber, in which the mixture of gases comprises tetra-ethyl-ortho-silicate (TEOS) and $N_2$. Compressive stress of a TEOS oxide film is increased by activating the mixture of gases.

18 Claims, 3 Drawing Sheets

TEOS DEPOSITION METHOD

BACKGROUND

The invention relates to manufacture of semiconductor devices, and more particularly, to a method for forming a low stress composite inter metal dielectric layer (IMD).

Inter metal dielectric layers (IMD) have been used in the semiconductor industry to passivate underlying metal interconnect structures, as well as to provide isolation of these same metal interconnect structures. Low k dielectric layers, such as hydrogen silsesquioxane (HSQ), and fluorinated silicon oxide glass (FSG) have provided the desired passivation, and isolation characteristics, as well as offering decreased capacitances, when compared to higher k dielectric layers, such as silicon oxide. The superior passivation characteristics of silicon oxide layers, such as minimum leakage and high dielectric breakdown strengths, however, make it an attractive candidate for IMD purposes, when compared to lower k dielectric layer counterparts.

One problem encountered with IMD layers, comprised of chemically vapor deposited silicon oxide layers, is the inherent stress of these layers, and the damage placed thereby on underlying elements of the semiconductor device. For example, an IMD layer can be a composite IMD layer, comprising an underlying layer, an IMD-1 component, such as a plasma enhanced silicon oxide layer formed using silane as a precursor, an IMD-2 component, featuring a sub-atmospheric chemically vapor deposited (SACVD) silicon oxide layer, or a capping plasma enhanced silicon oxide layer (IMD-3) component formed using tetraethylorthosilicate, (TEOS) as precursor. The IMD-2 component, in this case SACVD silicon oxide, which is required to provide the desired gap filling, inherently comprises a high tensile stress, which induces unwanted bowing up or down of the underlying semiconductor substrate.

This type of bowing can result in cracking of underlying insulator layers, as well as disruptions or opens in underlying metal interconnect patterns. The capping dielectric layer, or the IMD-3 component, formed by plasma enhanced chemical vapor deposition, using TEOS as a source, inherently comprises a compressive stress, which supplies a convex or bowing down effect on the underlying semiconductor and elements thereof. The degree of compressive stress, provided by the IMD-3, PETEOS silicon oxide layer, formed using conventional deposition methods, however, may be insufficient to overcome the high tensile stress of the IMD-2, SACVD silicon oxide component, therefore the deleterious bowing up or down effects may still occur.

IMD cracking due to stress can be eliminated by reducing IMD-2 thickness, but a thinner IMD-2 layer would result in bad gap-filling. Additionally, the above described cracks can also be eliminated by increasing RF power or $O_2$/TEOS ratio, but high RF power reduces the life span of chamber parts, and film deposited by high RF power has poor wafer to wafer uniformity and unstable film stress.

Another disadvantage of the conventional TEOS deposition method is shown in FIG. 1. Voids 10 are easily formed near the surface of the IMD film 20 between two metal patterns due to slow TEOS deposition rate. Thus, voids 10 are likely to be exposed during subsequent chemical mechanical polish (CMP) process, generating leakage or reliability problems.

U.S. Pat. No. 6,121,164 discloses a method and apparatus for forming a halogen-doped silicon oxide film, preferably a fluorinated silicon glass (FSG) film, having compressive stress less than about $-5 \times 10^8$ dynes/cm$^2$. In a specific embodiment, the FSG film is formed by a sub-atmospheric CVD thermal process at a pressure of between about 60-650 torr. The relatively thin film, besides having a low dielectric constant and good gap fill capability, has low compressive stress, and is particularly suitable for use as an intermetal (IMD) layer. U.S. Pat. No. 6,426,285 discloses using TEOS as a source, and using a set of power, and frequency conditions, resulting in a high compressive stress for the capping silicon oxide layer.

SUMMARY

Embodiments of the invention achieve technical advantages by mixing N containing gas combined with process gases when forming a plasma enhanced TEOS (PETEOS) film.

In accordance with an embodiment of the invention, a deposition method of PE-TEOS oxide layer having an increased compressive stress is disclosed. A mixture of gases is introduced into a process chamber, in which the mixture of gases comprising tetra-ethyl-ortho-silicate (TEOS) and N2. Plasma is formed by activating the mixture of gases to deposit an oxide layer on a substrate.

In accordance with the embodiment of the invention, an interconnect structure comprises two metal lines disposed on a substrate and a TEOS film disposed on the substrate and the metal lines, wherein the TEOS film comprises a void between the metal lines, and the void is under the surface of the metal lines.

BRIEF DESCRIPTION OF THE DRAWINGS

The invention can be more fully understood by reading the subsequent detailed description in conjunction with the examples and references made to the accompanying drawings, wherein.

DETAILED DESCRIPTION

Figure 1:
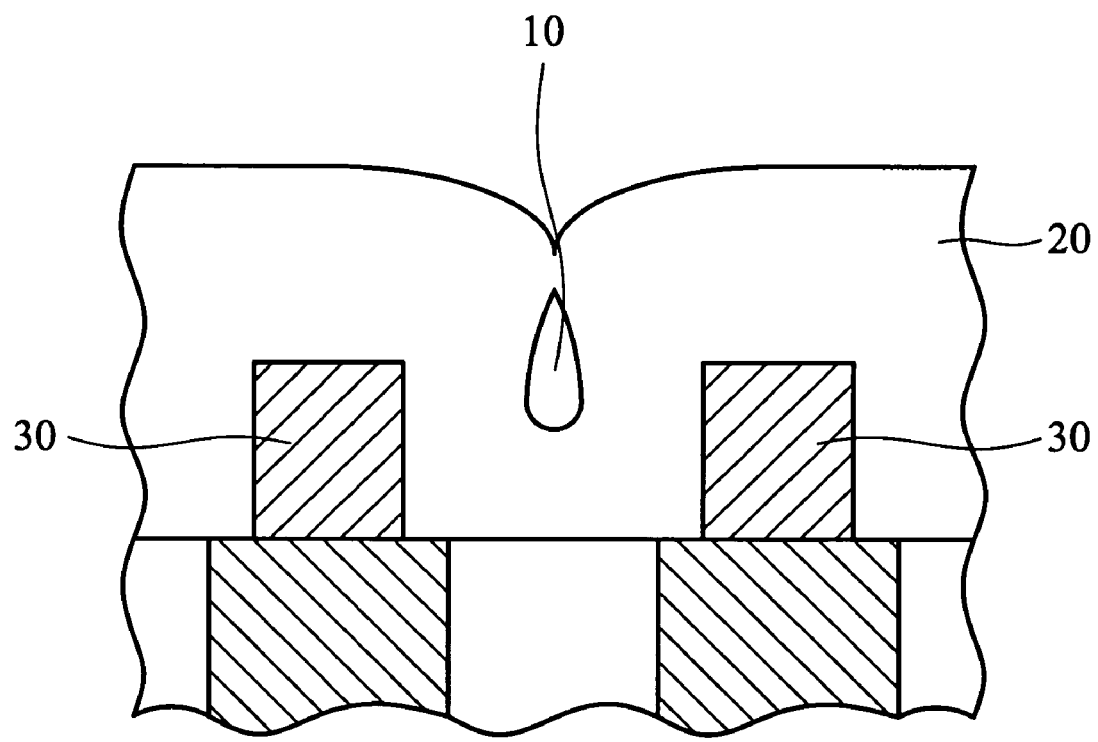
FIG. 1 is a cross section of an inter metal line structure, which schematically illustrates a void in an inter metal dielectric layer near the inter metal dielectric layer surface.

Embodiments of the invention, which provides a novel deposition method for increasing TEOS film compressive stress, will be described in greater detail by referring to the drawings that accompany the invention. It is noted that in the accompanying drawings, like and/or corresponding elements are referred to by like reference numerals.

Figure 2:
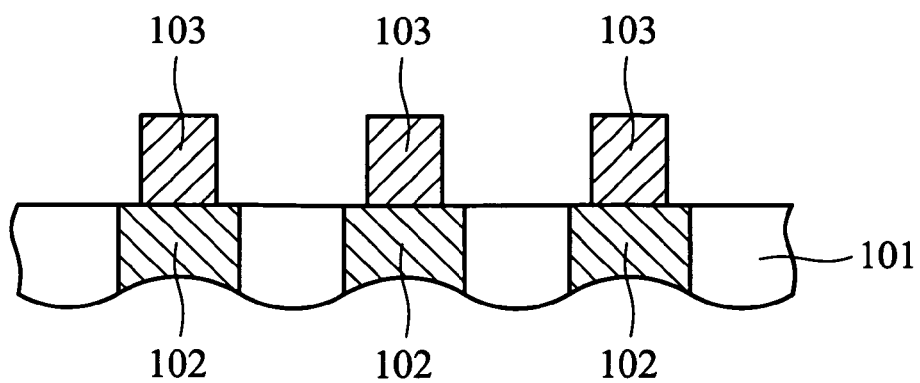
FIGS. 2-4 show the process steps to form the composite IMD layers of an embodiment of the invention.

The method of forming a composite IMD layer, featuring a capping silicon oxide layer with a high compressive stress to balance the tensile stress of underlying silicon oxide components will now be described in detail. Conductive regions 102, comprised of either metal plugs or lower level metal interconnect structures, formed from a conductive material of aluminum, tungsten, tungsten silicide or copper, are shown schematically in FIG. 2. The metal interconnect structures are formed in a damascene type in an insulator layer 101 comprising silicon oxide or borophosphosilicate glass. The described metal interconnect structures 102 and the insulator layer 101 are formed on a substrate. It is understood that the substrate may contain a substructure comprising devices and various other layers including the insulator layer 101, in which conductive regions 102 are formed. Inasmuch as the methods utilized in forming such semiconductor structures are well known in the art, they are not presented here in order not to obscure the main aspects of the invention.

Metal interconnect structures 103, conductive lines, are formed of aluminum, aluminum-copper, tungsten or copper, next formed overlying and contacting the conductive regions 102. Metal interconnect structures 103 are formed by conventional deposition and patterning procedures.

Figure 3:
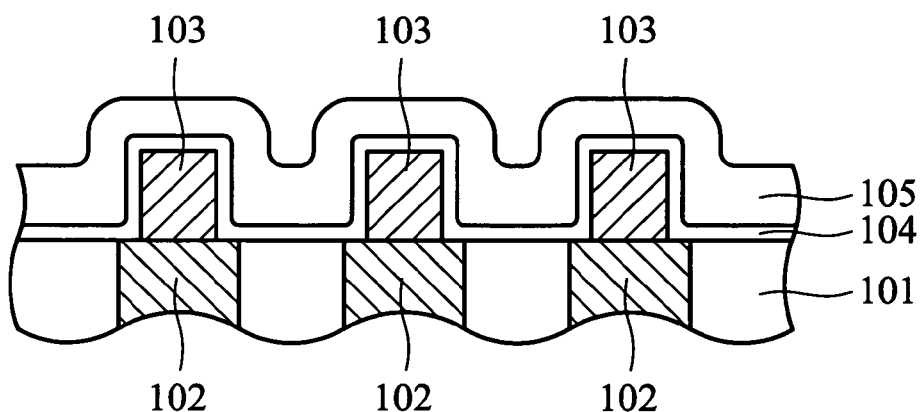
Figure 4:
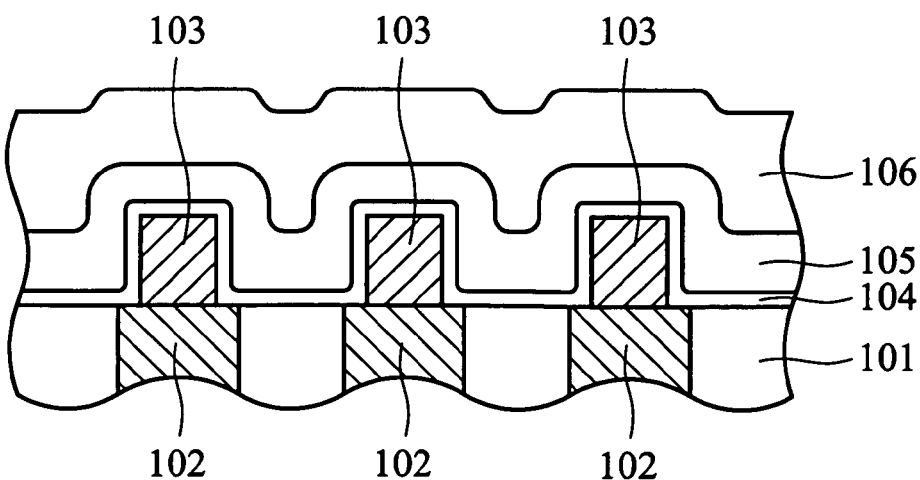

A first component of a composite IMD layer, IMD-1, is next conformally deposited on the metal interconnect structures 103 and the insulator layer 101. IMD-1, or first silicon oxide layer 104, schematically shown in FIG. 3, is deposited by plasma enhanced chemical vapor deposition (PECVD) to a thickness between about 750 to 1250 Å at a temperature between about 350 to 450° C., using silane and nitrous oxide as reactants, or TEOS as a precursor. The first silicon oxide layer 104, or IMD-1 component, deposited using the above reactants, results in excellent coverage of the underlying metal interconnect structures 103, and is formed with a low compressive stress of about $-0.5 \times 10^8$ to $-1.5 \times 10^8$ dynes/cm$^2$. A second component of a composite IMD layer, IMD-2, is then deposited using subatmospheric chemical vapor deposition (SACVD), resulting in a second silicon oxide layer 105, shown schematically in FIG. 3. The SACVD layer presents excellent step coverage properties, allowing gap filling of intermetallic spacings to be easily accomplished. The second silicon oxide layer 105, formed at a thickness between about 3500 to 4500 Å, at a deposition temperature between about 350 to 450° C., using TEOS as a precursor, is comprised of a high tensile stress between about $3.5 \times 10^9$ to $4.5 \times 10^9$ dynes/cm$^2$. The high tensile stress contained in the second silicon oxide layer 105 can result in bowing up or down of the underlying semiconductor substrate during subsequent processing procedures.

The phenomena of bowing up can crack or damage dielectric layers, as well as interrupt the continuity of metal interconnect structures, resulting in yield or reliability problems. Therefore an overlying or capping silicon oxide layer formed with a high compressive stress is required to balance the tensile stress supplied by the underlying second silicon oxide layer 105. A third silicon oxide layer or IMD-3, is deposited using conventional PECVD procedures, using TEOS as a source, may however not result in the desired compressive stress. The use of TEOS, for a PECVD silicon oxide layer, deposited at a temperature between about 350 to 450° C., to a thickness between about 6000 to 9000 Å, using conventional power and conditions, such as an initial power of about 800 to 1000 watts, at an initial frequency between about 13 to 14 MHz, followed by the use of a final power of about 0 to 600 watts, at a final frequency between about 100 to 400 Khz, results in a silicon oxide layer with a compressive stress of only between about $-1.7 \times 10^9$ to $-2.0 \times 10^9$ dynes/cm$^2$. Such a compressive stress still may be insufficient to overcome the tensile stress of the second silicon oxide layer 105. A novel deposition method resulting in a greater compressive stress for the third silicon oxide layer 106 will now be described.

Consequently, TEOS, He and $O_2$ are process gases used for depositing a TEOS oxide layer. In the invention, an N containing gas, such as $N_2$, NO, $N_2O$ or $NH_3$ gas is mixed with TEOS, He and $O_2$ when forming the third silicon oxide layer 106. The third silicon oxide layer is deposited at a temperature between about 300° C.~500° C., a pressure between about 5~8 Torr, a RF power between about 800 Watt~1000 Watt and a frequency between about 13~14 MHz. In addition, the N2/TEOS flow rate ratio is 1/3~1, in which the $N_2$ flow rate is 3000 sccm~10000 sccm and the TEOS flow rate is 6500 sccm~10500 sccm, and the $O_2$ flow rate is 2300~3000 sccm and the He flow rate is 500 sccm~1500 sccm.

TABLE 1

| | | TEOS layer(8K) | TEOS layer (Increasing RF power) | TEOS layer (adding $N_2$) |
|---|---|---|---|---|
| THK | Wafer #1 | 7759 Å/77.59 s | 7769 Å/70.62 s | 7755 Å/59.65 s |
| | Wafer #2 | 8114 Å/81.14 s | 7928 Å/72.07 s | 7725 Å/59.4 s |
| U % | Wafer #1 | 2.249 | 2.769 | 1.763 |
| | Wafer #2 | 2.429 | 2.556 | 1.702 |
| Stress | Wafer #1 | −1.997E+09 | −2.30E+09 | −2.57E+09 |
| | Wafer #2 | −2.01E+09 | −2.33E+09 | −2.60E+09 |

Referring to Table 1, compressive strength of the silicon oxide layer is increased from around $-1.997 \times 10^9$ dynes/cm$^2$ to $-2.60 \times 10^9$ dynes/cm$^2$ for the mixture of N2 and processing gas (TEOS, He and $O_2$). Consequently, compressive strength of the third oxide layer is greater than that of the first oxide layer. Due to the increased compressive strength of the third silicon oxide layer 106, tensile strength of the underlying second oxide layer 105 formed by SACVD is compensated, addressing the bowing up or down crack problems.

Figure 5:
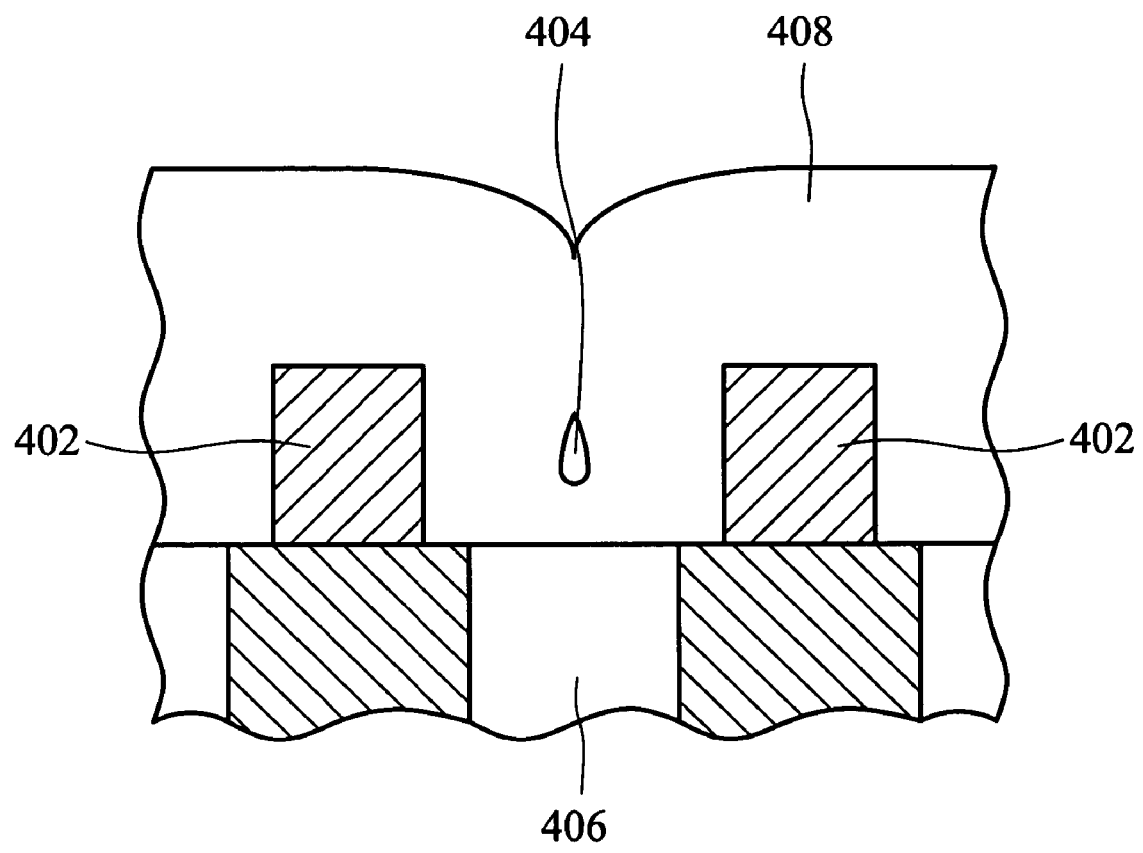
FIG. 5 is a cross section of an inter metal line structure, which schematically illustrates a void far from the upper surface of the IMD layer, below the interconnection level.

Additionally, as shown in Table 1, deposition rate of the silicon oxide layer is increased from around 100 Å/s to 120 Å/s~150 Å/s when mixing $N_2$, and uniformity is decreased from around 2.2 to 1.7. The increase in the deposition rate may be due to increased ionized TEOS or oxide radical, generated by the collision of $N_2$. Referring to FIG. 5, due to the increased deposition rate of the oxide layer with $N_2$ mixed with processing gas, a gap between two metal interconnect structures 402 is sealed more quickly, such that if a void 404 is formed, it will be buried more deeply in the oxide layer 408, under surface of the metal interconnect structures 402, not easily exposed during subsequent CMP process.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of thee appended claims should be accorded the broadest interpretation so as to encompass all such modifications and similar arrangements.

What is claimed is:

1. A deposition method of PE-TEOS oxide layer having an increased compressive stress, comprising:
   introducing a mixture of process gases into a process chamber, the mixture of process gases comprising tetra-ethyl-ortho-silicate(TEOS) and $N_2$; and
   forming a plasma by activating the mixture of process gases to deposit an oxide layer on a substrate, wherein the $N_2$/TEOS has a flow rate ratio between about 0.29 and about 0.46.

2. The method as claimed in claim 1, further comprising introducing $O_2$ and He.

3. The method as claimed in claim 1, wherein the oxide layer is deposited at a process pressure of 5~8 Torr.

4. The method as claimed in claim 1, wherein the oxide layer is deposited at a process temperature of 300° C.~500°°C.

5. The method as claimed in claim 1, wherein the TEOS has a flow rate of 6500 sccm~10500 sccm.

6. The method as claimed in claim 1, wherein the oxide layer is deposited at a deposition rate of 120 Å/s~150 Ås.

7. A PE-TEOS oxide layer deposited according to the deposition method of claim 1, which has a thickness of 6000~9000 Å, a uniformity lower than 1.8, and compressive stress more than $-2.55 \times 10^9$ dynes/cm$^2$.

8. A method for depositing an inter metal dielectric layer over a plurality of conductive lines, the method comprising:
depositing a first oxide layer having a compressive stress on the conductive lines by a PECVD method;
depositing a second oxide layer having a tensile stress on the first oxide layer by a SACVD method; and
depositing a third oxide layer on the second oxide layer by a PECVD method with a plasma from a mixture of process gases comprising TEOS and N$_2$, the third oxide layer having a compressive stress greater than of the first oxide layer, wherein the N$_2$/TEOS has a flow rate ratio between about 0.29 and about 0.46.

9. The method as claimed in claim 8, further comprising introducing O$_2$ and He.

10. The method as claimed in claim 8, wherein the third oxide layer is deposited at a process pressure of 5~8Torr.

11. The method as claimed in claim 8, wherein the third oxide layer is deposited at a process temperature of 300° C.~500° C.

12. The method as claimed in claim 8, wherein the TEOS has a flow rate of 6500 sccm~10500 sccm.

13. The method as claimed in claim 8, wherein the third oxide layer is deposited at a deposition rate of 120 Å/s~150 Ås.

14. An interconnect structure, comprising:
a substrate;
two metal lines disposed on the substrate; and
an oxide film disposed on the substrate and the metal lines, wherein the oxide film comprises a void between the metal lines, and the void is within the oxide film and under the surface of the metal lines, the oxide film is formed with a plasma from N2 and TEOS, the N$_2$/TEOS has a flow rate ratio between about 0.29 and about 0.46, and the oxide film has a compressive stress more than $-2.55 \times 10^9$ dynes/cm$^2$.

15. A deposition method of PE-TEOS oxide layer having an increased compressive stress, comprising:
introducing a mixture of process gases into a process chamber, the mixture of process gases comprising tetra-ethyl-ortho-silicate(TEOS) and an N containing gas selected from the group consisting of NO, N$_2$O and NH$_3$; and
forming a plasma by activating the mixture of process gases to deposit an oxide layer on a substrate, wherein the N containing gas/TEOS has a flow rate ratio between about 0.29 and about 0.46.

16. The method as claimed in claim 15, further comprising introducing O$_2$ and He.

17. A method for depositing an inter metal dielectric layer over a plurality of conductive lines, the method comprising:
depositing a first oxide layer having a compressive stress on the conductive lines by a PECVD method;
depositing a second oxide layer having a tensile stress on the first oxide layer by a SACVD method; and
depositing a third oxide layer on the second oxide layer by a PECVD method with a plasma from a mixture of process gases comprising TEOS and an N containing gas selected from the group consisting of NO, N$_2$O and NH$_3$, the third oxide layer having a compressive stress greater than of the first oxide layer, wherein the N containing gas/TEOS has a flow rate ratio between about 0.29 and about 0.46.

18. The method as claimed in claim 17, further comprising introducing O$_2$ and He.

* * * * *